US009554494B2

(12) United States Patent
Tai et al.

(10) Patent No.: US 9,554,494 B2
(45) Date of Patent: Jan. 24, 2017

(54) TRANSPARENT ELECTROMAGNETIC INTERFERENCE SHIELD

(71) Applicant: National Tsing Hua University, Hsinchu (TW)

(72) Inventors: Nyan-Hwa Tai, Hsinchu (TW); I-Ting Kuo, Taipei (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 14/552,656

(22) Filed: Nov. 25, 2014

(65) Prior Publication Data

US 2015/0359147 A1 Dec. 10, 2015

(30) Foreign Application Priority Data

Jun. 5, 2014 (TW) ............................ 103119575 A

(51) Int. Cl.
*H05K 9/00* (2006.01)

(52) U.S. Cl.
CPC .................................. *H05K 9/0096* (2013.01)

(58) Field of Classification Search
CPC ............................... E06B 5/18; H05K 9/0096
USPC ................................................ 361/816, 818
See application file for complete search history.

(56) References Cited

U.S. PATENT DOCUMENTS 5,012,041 A * 4/1991 Sims .................... H05K 9/0005 174/381
6,262,364 B1 7/2001 Yoshikawa et al.
8,222,321 B2 7/2012 Youm et al.
8,493,749 B2 7/2013 Myers et al.
2006/0257638 A1* 11/2006 Glatkowski .............. C09D 5/24 428/292.1
2010/0182765 A1* 7/2010 Vadas .................. H05K 1/0218 361/818
2012/0194441 A1* 8/2012 Frey ........................ G06F 3/041 345/173
2013/0048339 A1* 2/2013 Tour ........................ H01B 1/04 174/126.1
2013/0228365 A1* 9/2013 Uprety .................... B32B 15/08 174/257
2013/0284244 A1* 10/2013 Kato ..................... H01L 51/442 136/252
2014/0087164 A1* 3/2014 LeMieux ............... C09D 11/52 428/220
2014/0120270 A1* 5/2014 Tour ........................ C23C 16/26 427/596
2015/0002760 A1* 1/2015 Morimoto ........... G02F 1/13338 349/12
2015/0156886 A1* 6/2015 Wang .................... G03F 7/0002 174/253

* cited by examiner

*Primary Examiner* — Hoa C Nguyen
*Assistant Examiner* — Stanley Tso
(74) *Attorney, Agent, or Firm* — Birch, Stewart, Kolasch & Birch, LLP

(57) ABSTRACT

A transparent electromagnetic interference shield includes a first transparent substrate and an electromagnetic interference shielding layer. The electromagnetic interference shielding layer includes a transparent conductive polymer film which is formed on the first transparent substrate, and a plurality of metallic warp and weft lines which are laid on the transparent conductive polymer film. The warp lines and the weft lines cross one another.

6 Claims, 6 Drawing Sheets

3
422
421
4
41
2

TRANSPARENT ELECTROMAGNETIC INTERFERENCE SHIELD

CROSS-REFERENCE TO RELATED APPLICATION

This application claims priority of Taiwanese Patent Application No. 103119575, filed on Jun. 5, 2014.

FIELD OF THE INVENTION

This invention relates to an electromagnetic interference shield, more particularly to a transparent electromagnetic interference shield that includes an electromagnetic interference shielding layer having a transparent conductive polymer film and a plurality of metal lines.

BACKGROUND OF THE INVENTION

Conventional electromagnetic interference shields are usually used in electronic devices to prevent electromagnetic waves of the electronic devices from leakage or to shield external electromagnetic waves from interfering the operation of the electronic devices.

A conventional electromagnetic interference shield usually includes an electromagnetic interference shielding layer of a metallic material. However, the metallic material is opaque, so that the conventional electromagnetic interference shield is not suitable for being used as a front plate or screen in a device, such as a display which requires the front plate to have high transparency.

SUMMARY OF THE INVENTION

Therefore, the object of the present invention is to provide a transparent electromagnetic interference shield that may overcome the aforesaid drawback associated with the prior art.

According to this invention, there is provided a transparent electromagnetic interference shield that comprises: a transparent substrate; and an electromagnetic interference shielding layer including a transparent conductive polymer film which is formed on the transparent substrate, and a plurality of metallic warp and weft lines which are laid on the transparent conductive polymer film. The warp lines and the weft lines cross one another.

BRIEF DESCRIPTION OF THE DRAWINGS

In drawings which illustrate embodiments of the invention.

DETAILED DESCRIPTION OF THE EMBODIMENTS

Figure 1:
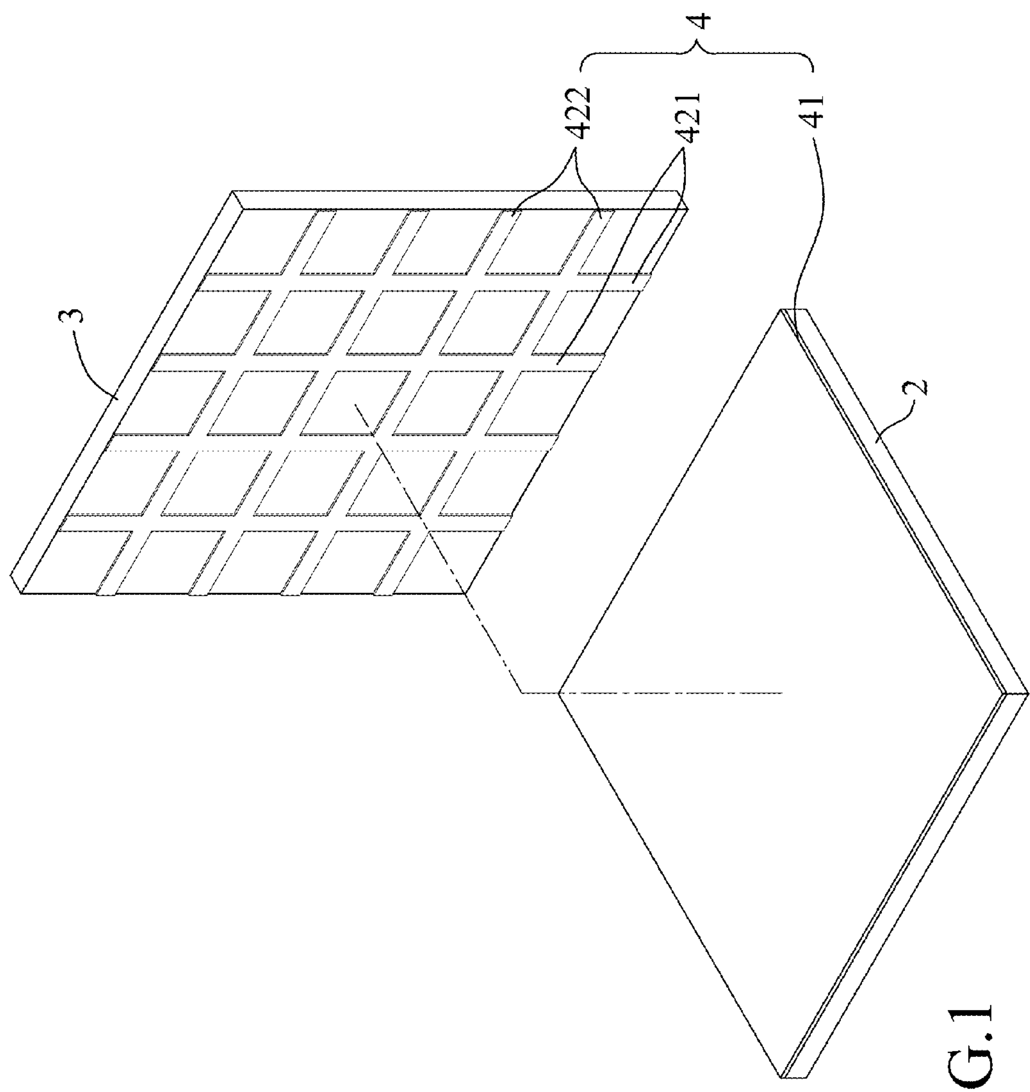
FIG. 1 is an exploded perspective view of an embodiment of a transparent electromagnetic interference shield according to the present invention.
Figure 2:
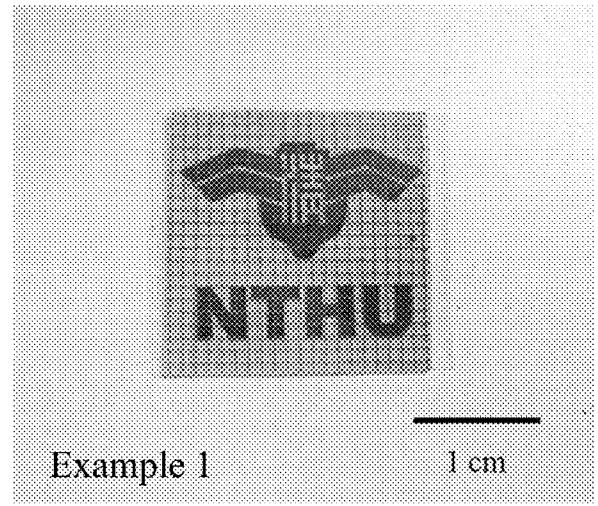
FIG. 2 is a top view of a transparent electromagnetic interference shield of Example 1.
Figure 3:
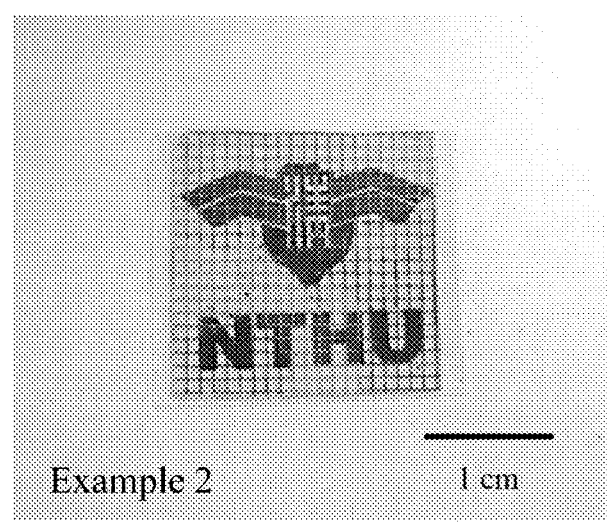
FIG. 3 is a top view of a transparent electromagnetic interference shield of Example 2.
Figure 4:
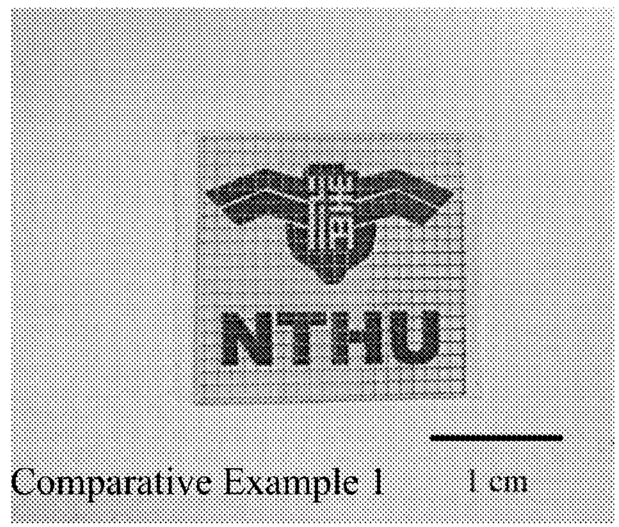
FIG. 4 is a top view of a transparent electromagnetic interference shield of Comparative Example 1.
Figure 5:
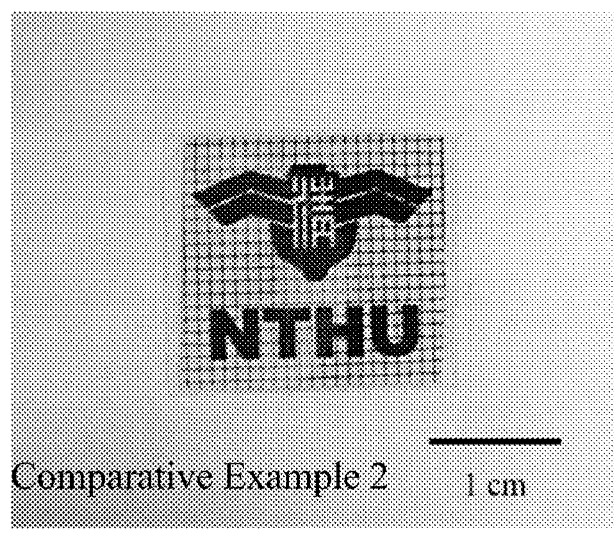
FIG. 5 is a top view of a transparent electromagnetic interference shield of Comparative Example 2.
Figure 6:
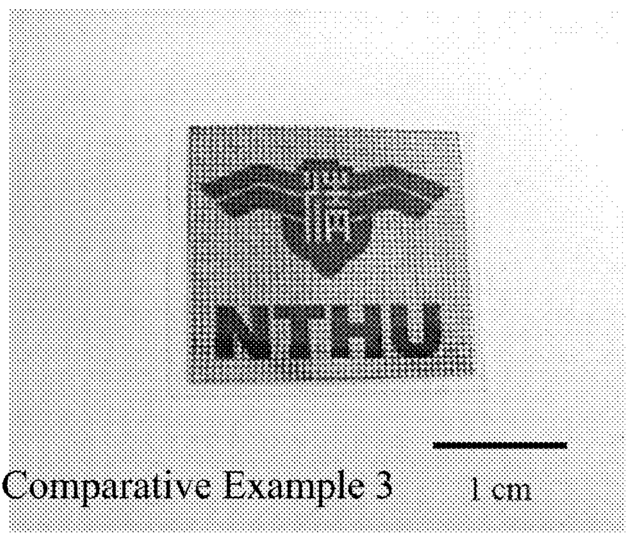
FIG. 6 is a top view of a transparent electromagnetic interference shield of Comparative Example 3.
Figure 7:
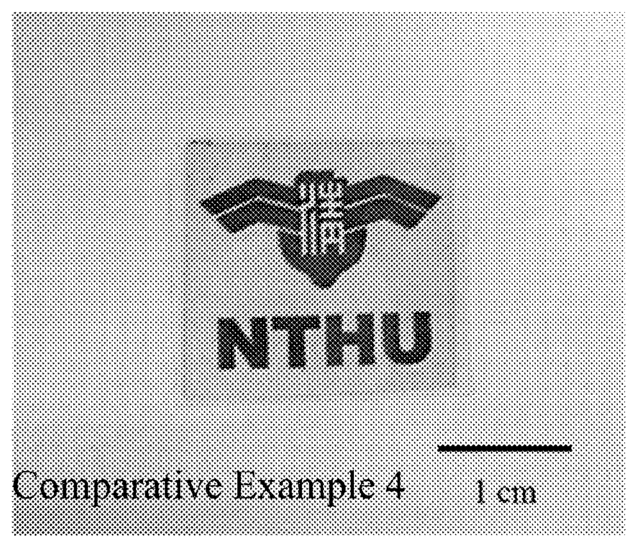
FIG. 7 is a top view of a transparent electromagnetic interference shield of Comparative Example 4.

FIG. 1 illustrates a first embodiment of a transparent electromagnetic interference shield according to the present invention. The transparent electromagnetic interference shield includes first and second transparent substrates 2, 3 and an electromagnetic interference shielding layer 4. The electromagnetic interference shielding layer 4 includes a transparent conductive polymer film 41 which is formed on the first transparent substrate 2, and a plurality of metallic warp and weft lines 421, 422 which are laid on the transparent conductive polymer film 41. The warp and weft lines 421, 422 cross one another.

In this embodiment, the warp and weft lines 421, 422 intersect one another to form a grid network.

In this embodiment, each of the warp and weft lines 421, 422 has a width ranging from 50 μm to 200 μm. Each of the weft lines 422 is spaced apart from an adjacent one of the weft lines 422 by a spacing ranging from 0.5 mm to 1.0 mm. Each of the warp lines 421 is spaced apart from an adjacent one of the warp lines 421 by a spacing ranging from 0.5 mm to 1.0 mm. The warp lines 421 and the waft lines 422 are perpendicular to one another.

The first and second transparent substrates 2, 3 are flexible, and are made from a material selected from the group consisting of polyethylene terephthalate (PET), polyethylene naphthalate (PEN), and polycarbonate. The first and second transparent substrates 2, 3 have a visible light transmittance greater than 96.16%

The transparent conductive polymer film 41 is made from a material containing a conductive polymer and carbon nanomaterials dispersed in the conductive polymer. Preferably, the conductive polymer is poly(3,4-ethylenedioxythiophene)-poly(styrenesulfonate) (PEDOT: PSS), polyaniline (PANI), polyacetylene (PAc), polypyrrole (PPy), polythiophene (PT), polystyrene (PS) and polyphenylene sulfide (PPS). The material of the transparent conductive polymer film 41 further includes a surfactant or a thinning agent that serves to assist dispersion of the carbon nanomaterials in the conductive polymer.

The carbon nanomaterials may be selected from carbon nanotubes, few-layer graphene, reduced graphene oxide, or reduced graphite oxide. More preferably, the carbon nanomaterials are surface modified. An amount of the carbon nanomaterials is lower than 2 wt % based on 100 wt % of the transparent conductive polymer film 41, so that the carbon nanomaterials can be uniformly dispersed to enhance electromagnetic interference shielding efficiency of the conductive polymer. The surface modified carbon nanomaterials, e.g., the surface modified few-layer graphene may be prepared by a method that includes the steps of: oxidizing graphite flakes, followed by reducing the oxidized graphite to form a reduced graphene oxide; and then dispersing the reduced graphene oxide into a potassium permanganate ($KMnO_4$) solution containing sulfuric acid ($H_2SO_4$) and hydrochloric acid (HCl). The sulfuric acid and potassium permanganate are beneficial for ion intercalation and oxidation, while the hydrochloric acid serves to create defects on the few-layer graphene to facilitate the surface modification of the few-layer graphene.

In this embodiment, the transparent electromagnetic interference shield has a sheet resistance not greater than 10 Ω/sq.

The transparent electromagnetic interference shield may be made by a method that includes the steps of: applying a material, which contains a conductive polymer and carbon nanomaterials dispersed in the conductive polymer, to the first transparent substrate 2 to form the transparent conductive polymer film 41; jet printing a silver nanoparticle solution (Silverjet DGP 40LT, available from Sigmatek corporation) containing silver nanoparticles on the second transparent substrate 3 to form the metallic warp and weft lines 421, 422; and hot pressing the first transparent substrate 2 and the second transparent substrate 3 to form the transparent electromagnetic interference shield.

Furthermore, the weft lines 421 may be printed on the first transparent substrate 2, the warp lines 422 may be printed on the second transparent substrate 3, and the transparent conductive polymer film 41 may be interposed between the first and second transparent substrates 2, 3.

The following Examples 1 and 2 and Comparative Examples 1 to 4 are provided to illustrate the embodiment of the invention. The examples should not be construed as limiting the scope of the invention.

Example 1

Two PET substrates having a length of 9 cm and a width of 9 cm were provided as a first transparent substrate and a second transparent substrate, respectively. A mark was formed on a bottom side of the first transparent substrate for serving as a background for observation.

An alcohol solvent (98%) was mixed with a conductive ink (LER-WR150 ELITE OPTOELECTRONIC CO., LTD, including PEDOT: PSS), at an alcohol:ink weight ratio of 1:1, to form a conductive polymer solution.

Few-layer graphene with a weight of 1.0 g was mixed with 200 mL of 3M $H_2SO_4$, 5 g of $KMnO_4$, and 50 mL of HCl sequentially at a temperature of 75° C. for several hours, followed by centrifuging, washing and drying to form surface modified few-layer graphene.

The surface modified few-layer graphene was dispersed in the conductive polymer solution to form a graphene-containing transparent conductive solution having 1 wt % of the surface modified few-layer graphene based on 100 wt % of the solution.

The graphene-containing transparent conductive solution was applied to a top side of the first transparent substrate, followed by drying at a temperature of 80° C. to form a transparent conductive polymer film on the first transparent substrate. The transparent conductive polymer film had a thickness of 100 nm.

The second transparent substrate was jet printed with a silver nanoparticle solution thereon through a dimatix materials printer (DMP) to form warp lines having a spacing of 1 mm between every two adjacent warp lines, followed by rotating the second transparent substrate 90° and then jet printing the silver particle solution on the second transparent substrate to form weft lines having a spacing of 1 mm between every two adjacent weft lines.

The warp lines and the weft lines were completely dried at a temperature of 130° C. and intersected one another to form a grid network.

The first transparent substrate formed with the transparent conductive polymer film and the second transparent substrate formed with the warp and weft lines were hot pressed at a temperature of 200° C. and under a pressure of 3.19× $10^{-5}$ Pa for 1 hour, followed by cutting to form a transparent electromagnetic interference shield having a length of 2 cm and a width of 2 cm of Example 1.

Example 2

The procedure and operating conditions of preparing the transparent electromagnetic interference shield of Example 2 were similar to those of Example 1, except that the transparent conductive polymer film of Example 2 is free of the surface modified few-layer graphene.

Comparative Example 1

The transparent electromagnetic interference shield of Comparative Example 1 differs from that of Example 1 in that the transparent electromagnetic interference shield of Comparative Example 1 does not have the transparent conductive polymer film.

In addition, the first transparent substrate was jet printed with the silver particle solution thereon through a dimatix materials printer (DMP) to form the warp lines having a spacing of 1 mm, and the second transparent substrate was jet printed with the silver particle solution to form the weft lines having a spacing of 1 mm.

The first transparent substrate formed with warp lines and the second transparent substrate formed with the weft lines were hot pressed to form a transparent electromagnetic interference shield.

Comparative Example 2

Comparative Example 2 differs from Comparative Example 1 in that Comparative Example 2 does not have the second transparent substrate.

In addition, the first transparent substrate was jet printed with the silver particle solution thereon through a dimatix materials printer (DMP) to form the warp lines having a spacing of 1 mm between every two adjacent warp lines, followed by jet printing the first transparent substrate with the silver particle solution to form the weft lines having a spacing of 1 mm between every two adjacent weft lines.

Comparative Example 3

Comparative Example 3 differs from Comparative Example 2 in that, in Comparative Example 3, the spacing between two adjacent ones of the weft lines is 0.5 mm, and the spacing between two adjacent ones of the warp lines is 0.5 mm.

Comparative Example 4

Comparative Example 4 differs from Example 2 in that Comparative Example 4 does not have the metallic warp and weft lines.

FIG. 2 to FIG. 7 are photo images of the transparent electromagnetic interference shields of Examples 1 and 2 and Comparative Examples 1 to 4, respectively.

Figure 8:
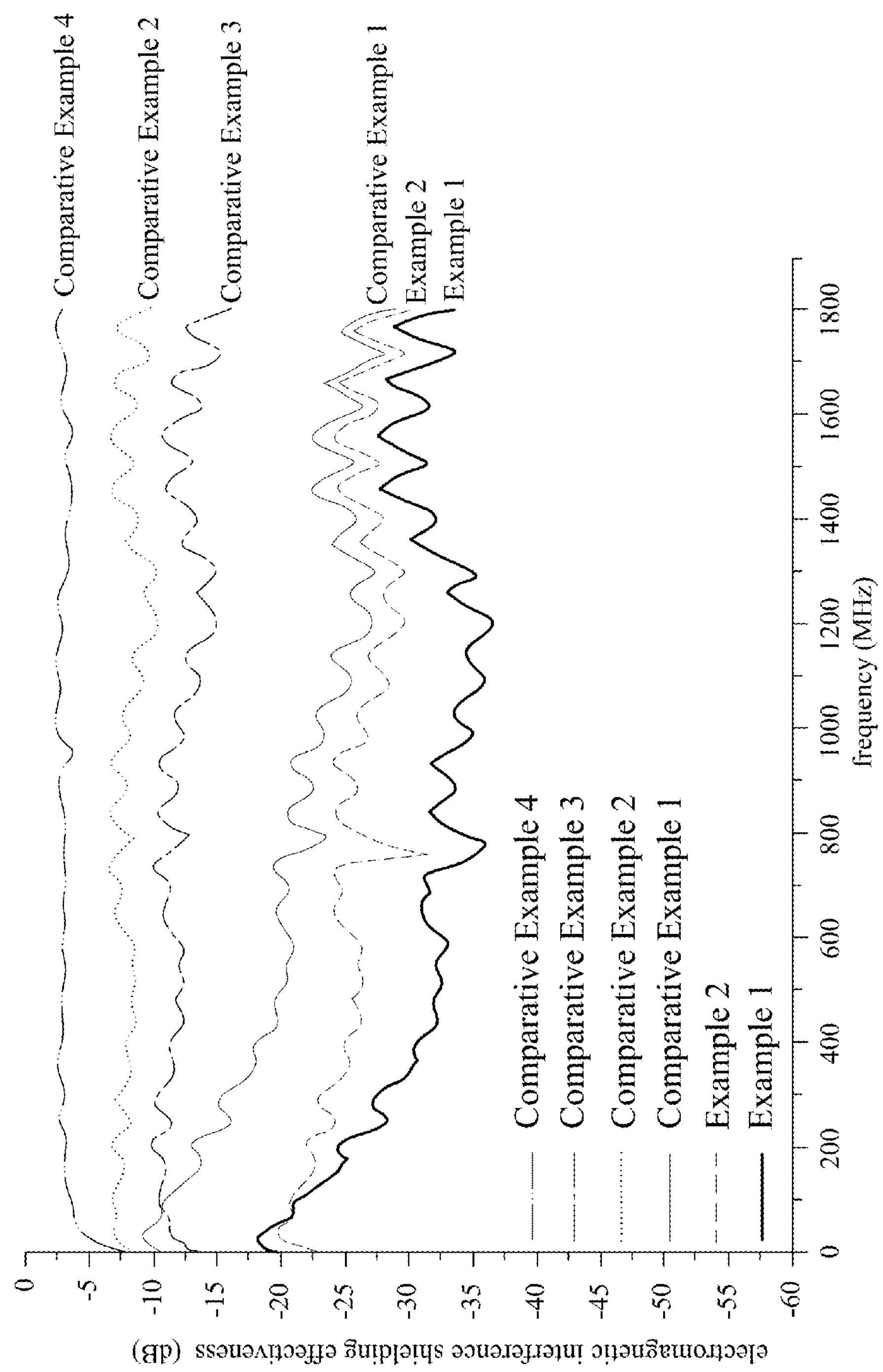
FIG. 8 is a plot of an electromagnetic interference shielding effectiveness vs. frequency for Examples 1-2 and Comparative Examples 1-4.

FIG. 8 is a plot of an electromagnetic interference shielding effectiveness (EMI SE) vs. electromagnetic frequency for Examples 1 and 2 and Comparative Examples 1 to 4. The frequency ranges from 0 Hz to 1.8 GHz. The average EMI SE values of Examples 1 and 2 and Comparative Examples 1, 2, 3, and 4 are respectively −30.74 dB, −25.66 dB, −21.18 dB, −8.01 dB, −12.11 dB and −2.59 dB. EMI SE percentages of Examples 1 and 2 and Comparative Examples 1, 2, 3, and 4 are respectively 99.92%, 99.73% 99.23%, 84.18%, 93.85%, 44.92%, which are calculated based on the following equation EMI SE (dB)=−10 log($P_{in}$/$P_{out}$), where $P_{in}$ is the intensity of the incident electromagnetic wave (Watt/m$^2$) and $P_{out}$ is the intensity of the transmission electromagnetic wave. The EMI SE percentage is the ratio of $P_{out}$ and $P_{in}$, which can be calculated according to $(P_{in}-P_{out})/P_{in}$.

Figure 9:
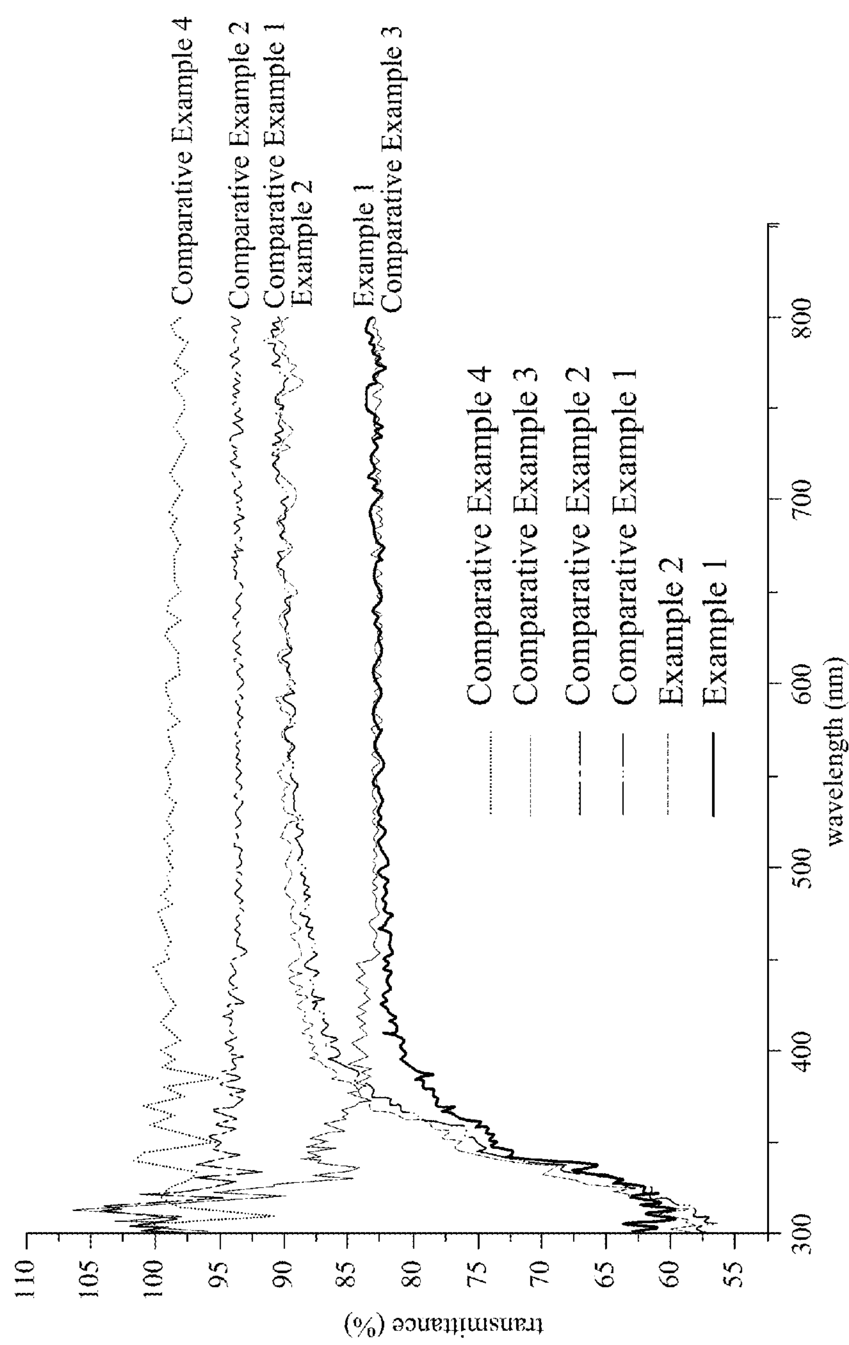
FIG. 9 is a plot of a transmittance vs. wavelength for Examples 1-2 and Comparative Examples 1-4.

FIG. 9 is a plot of transmittance vs. light wavelength for Examples 1 and 2 and Comparative Examples 1 to 4. The wavelength ranges from 300 nm to 800 nm. The transmittances of Examples 1 and 2 and Comparative Examples 1, 2, 3, and 4 are, respectively, 82.71%, 90.45%, 89.33%, 93.45%, 82.78%, and 98.87% under the wavelength of 550 nm. Although Comparative Example 4 has greatest transmittance, the same has a relatively poor EMI SE percentage (44.92%).

Table 1 shows the transmittance under the wavelength of 550 nm (T), the sheet resistance (R), the average EMI SE value under the frequency ranging from 0 Hz to 1.8 GHz ($E_{SE}$), the average width of each of the warp and weft lines (D), and the EMI SE percentage for Examples 1 and 2 and Comparative Examples 1 to 4.

TABLE 1

| | T (%) | R (Ω/sq) | $E_{SE}$ (dB) | D (μm) | EMI SE percentage (%) |
|---|---|---|---|---|---|
| Example 1 | 82.71 | 1.86 ± 0.09 | −30.74 | 191.2 ± 13.79 | 99.92 |
| Example 2 | 90.45 | 8.15 ± 0.28 | −25.66 | 186.00 ± 21.41 | 99.73 |
| Comparative Example 1 | 89.33 | 21.60 ± 4.51 | −21.18 | 172.25 ± 16.17 | 99.23 |
| Comparative Example 2 | 93.45 | 27.50 ± 1.00 | −8.01 | 60.90 ± 6.67 | 84.18 |
| Comparative Example 3 | 82.78 | 24.67 ± 2.16 | −12.11 | 85.65 ± 5.55 | 93.85 |
| Comparative Example 4 | 98.87 | 710.70 ± 227.2 | −2.59 | N/A | 44.92 |

Comparative Example 4 has a highest sheet resistance. The sheet resistances of Comparative Examples 1 to 3 are higher than those of Examples 1 and 2. The results show that the sheet resistance may be reduced with inclusion of the transparent conductive polymer film and the metallic warp and weft lines, and could be further reduced with inclusion of the surface modified few-layer graphene in the transparent conductive polymer film.

The EMI SE percentage of Comparative Example 2 is less than that of Comparative Example 1, which may be attributed to defects formed on the weft lines during jet printing of the silver particle solution on the warp lines and the first transparent substrate to form the weft lines. The presence of the warp lines on the first transparent substrate results in the non-uniform distribution of metallic particles on the first transparent substrate, which may be the cause of forming the defects on the weft lines. The results shown in Table 1 and FIG. 8 show that the EMI SE percentage of the transparent electromagnetic interference shield of Example 1 is much higher than those of Comparative Examples 1 to 4. Moreover, the EMI SE percentage of Example 2 is similar to that of Comparative Example 1 while the sheet resistance of Example 2 is much lower than that of Comparative Example 1 and having transmittance similar to that of Comparative Example 1.

With the inclusion of the transparent conductive polymer film 41 and the metallic warp and weft lines 421, 422 in the electromagnetic interference shielding layer 4 of the transparent electromagnetic interference shield of this present invention, the aforesaid drawback associated with the prior art can be eliminated.

While the present invention has been described in connection with what are considered the most practical embodiment, it is understood that this invention is not limited to the disclosed embodiments but is intended to cover various arrangements included within the spirit and scope of the broadest interpretation and equivalent arrangements.

What is claimed is:

1. A transparent electromagnetic interference shield comprising:

a first transparent substrate;

a second transparent substrate; and an electromagnetic interference shielding layer interposed between said first and second transparent substrates and including a transparent conductive polymer film which is formed on said first transparent substrate, and a plurality of metallic warp and weft lines which are laid on said transparent conductive polymer film, said warp lines and said weft lines intersecting one another to form a grid network;

wherein said transparent conductive polymer film includes a conductive polymer and surface-modified few-layer graphene dispersed in the conductive polymer, wherein said warp lines are printed on said second transparent substrate, and said weft lines are printed on said second transparent substrate and said warp lines, wherein each of said warp and weft lines has a width ranging from 50 μm to 200 μm, wherein each of said weft lines is spaced apart from an adjacent one of said weft lines by a spacing ranging from 0.5 mm to 1.0 mm apart, and each of said warp lines is spaced apart from an adjacent one of said warp lines by a spacing ranging from 0.5 mm to 1.0 mm, wherein the transparent electromagnetic interference shield has a sheet resistance not greater than 10 Ω/sq.

2. The transparent electromagnetic interference shield of claim 1, wherein said surface-modified few-layer graphene is present in an amount of lower than 2 wt % based on 100 wt % of said transparent conductive polymer film.

3. The transparent electromagnetic interference shield of claim 1, wherein said warp and weft lines are made from silver nanoparticles.

4. The transparent electromagnetic interference shield of claim 1, wherein said first and second transparent substrates are flexible, and are made from a material selected from the group consisting of polyethylene terephthalate, polyethylene naphthalate, and polycarbonate.

5. The transparent electromagnetic interference shield of claim 1, wherein said conductive polymer is selected from the group consisting of poly(3,4-ethylenedioxythiophene)-poly(styrenesulfonate), polyaniline, polyacetylene, polypyrrole, polythiophene, polystyrene and polyphenylene sulfide.

6. The transparent electromagnetic interference shield of claim 1, wherein said weft lines are printed on said first transparent substrate, said warp lines being printed on said second transparent substrate.

* * * * *